US010121887B2

(12) United States Patent
Yagi et al.

(10) Patent No.: US 10,121,887 B2
(45) Date of Patent: *Nov. 6, 2018

(54) INSULATED GATE SEMICONDUCTOR DEVICE AND METHOD

(71) Applicant: SEMICONDUCTOR COMPONENTS INDUSTRIES, LLC, Phoenix, AZ (US)

(72) Inventors: Haruyoshi Yagi, Tokyo (JP); Manabu Yajima, Gunma (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 97 days.

This patent is subject to a terminal disclaimer.

(21) Appl. No.: 14/618,571

(22) Filed: Feb. 10, 2015

(65) Prior Publication Data

US 2015/0171071 A1    Jun. 18, 2015

Related U.S. Application Data

(63) Continuation of application No. 13/982,668, filed as application No. PCT/JP2012/000875 on Feb. 9, 2012, now Pat. No. 8,981,471.

(30) Foreign Application Priority Data

Feb. 17, 2011    (JP) ................. 2011-032342

(51) Int. Cl.
H01L 29/00    (2006.01)
H01L 27/00    (2006.01)
(Continued)

(52) U.S. Cl.
CPC .. *H01L 29/7813* (2013.01); *H01L 21/823475* (2013.01); *H01L 23/4824* (2013.01);
(Continued)

(58) Field of Classification Search
CPC ......... H01L 29/7808; H01L 21/823475; H01L 27/0255; H01L 27/0629; H01L 27/0207;
(Continued)

(56) References Cited

U.S. PATENT DOCUMENTS 6,906,386 B2    6/2005  Williams et al.
8,981,471 B2 *  3/2015  Yagi ................ H01L 21/82347
                                          257/331
(Continued)

FOREIGN PATENT DOCUMENTS

JP    05335583 A  * 12/1993
JP    10-125907     5/1998
(Continued)

OTHER PUBLICATIONS

International Search Report dated Mar. 13, 2012, directed to International Application No. PCT/JP2012/000875; 3 pages.

*Primary Examiner* — Dale E Page
*Assistant Examiner* — Quovaunda V Jefferson
(74) *Attorney, Agent, or Firm* — Kevin B. Jackson

(57) ABSTRACT

In a MOSFET, the lead parts of gate lead wiring that lead out a gate electrode on the periphery of a substrate constitute a non-operative region where it is impossible to dispose a MOSFET transistor cell (C) that will function as efficiently as inside an element region. If the gate lead wiring is disposed along the four edges of a chip, for example, the area of the non-operative region increases, limiting the extent to which the surface area of the element region can be enlarged and the chip surface area reduced. In the present invention, gate lead wiring and a conductor, which is connected to the gate lead wiring and a protection diode, are disposed in a non-curved, linear configuration along one edge of a chip. In addition, a first gate electrode layer that extends superimposed on the gate lead wiring and the conductor, and connects the gate lead wiring and the con-
(Continued)

ductor to the protection diode, has no more than one curved part. Furthermore, the protection diode is disposed adjacent to the conductor or the gate lead wiring, and a portion of the protection diode is disposed near a gate pad.

22 Claims, 7 Drawing Sheets

(51) Int. Cl.
  *H01L 29/78*    (2006.01)
  *H01L 21/8234*  (2006.01)
  *H01L 27/06*    (2006.01)
  *H01L 23/482*   (2006.01)
  *H01L 29/423*   (2006.01)
  *H01L 29/739*   (2006.01)
  *H01L 49/02*    (2006.01)
  *H01L 23/00*    (2006.01)
  *H01L 27/02*    (2006.01)
  *H01L 29/06*    (2006.01)
  *H01L 29/87*    (2006.01)

(52) U.S. Cl.
  CPC ...... *H01L 27/0255* (2013.01); *H01L 27/0288* (2013.01); *H01L 27/0629* (2013.01); *H01L 28/20* (2013.01); *H01L 29/0696* (2013.01); *H01L 29/4238* (2013.01); *H01L 29/42372* (2013.01); *H01L 29/7397* (2013.01); *H01L 29/7803* (2013.01); *H01L 29/7808* (2013.01); *H01L 29/7811* (2013.01); *H01L 24/05* (2013.01); *H01L 24/13* (2013.01); *H01L 27/0207* (2013.01); *H01L 29/0619* (2013.01); *H01L 29/0692* (2013.01); *H01L 29/87* (2013.01); *H01L 2224/0401* (2013.01); *H01L 2224/05008* (2013.01); *H01L 2224/05554* (2013.01); *H01L 2224/05567* (2013.01); *H01L 2224/05569* (2013.01); *H01L 2224/05572* (2013.01); *H01L 2224/13022* (2013.01); *H01L 2224/1415* (2013.01); *H01L 2924/00014* (2013.01); *H01L 2924/01006* (2013.01); *H01L 2924/01082* (2013.01); *H01L 2924/12036* (2013.01); *H01L 2924/1305* (2013.01); *H01L 2924/13055* (2013.01); *H01L 2924/13091* (2013.01)

(58) Field of Classification Search
  CPC ............ H01L 29/0696; H01L 29/7811; H01L 29/7813; H01L 29/42372; H01L 29/4238; H01L 29/7397; H01L 29/7803; H01L 29/0619; H01L 23/4824; H01L 24/13
  See application file for complete search history.

(56) References Cited

U.S. PATENT DOCUMENTS

| | | | |
|---|---|---|---|
| 2006/0157779 A1* | 7/2006 | Kachi | H01L 29/66727 257/330 |
| 2007/0034943 A1* | 2/2007 | Kushiyama | H01L 24/05 257/330 |
| 2010/0187640 A1* | 7/2010 | Miyata | H01L 29/41775 257/401 |
| 2010/0193864 A1 | 8/2010 | Tokuda | |
| 2010/0327359 A1 | 12/2010 | Nakazawa et al. | |

FOREIGN PATENT DOCUMENTS

| | | |
|---|---|---|
| JP | 2004-281524 | 10/2004 |
| JP | 2010-177454 | 8/2010 |
| JP | 2010-182740 | 8/2010 |

* cited by examiner

FIG.6A

| Chip Size | | | Conventional Structure | | Present Embodiment | | Effect of On-resistance Reduction [%] |
|---|---|---|---|---|---|---|---|
| X [mm] | Y [mm] | Area of Chip [mm²] | Area of Element Region [mm²] | On-resistance [mΩ] | Area of Element Region [mm²] | On-resistance [mΩ] | |
| 0.5 | 0.5 | 0.25 | 0.230 | 43.48 | 0.245 | 40.82 | 93.9 |
| 1.0 | 1.0 | 1.00 | 0.960 | 10.42 | 0.990 | 10.10 | 97.0 |
| 1.5 | 1.5 | 2.25 | 2.190 | 4.57 | 2.235 | 4.474 | 98.0 |

FIG.6B

| Chip Size | | | Conventional Structure | | Present Embodiment | | Effect of On-resistance Reduction [%] |
|---|---|---|---|---|---|---|---|
| X [mm] | Y [mm] | Area of Chip [mm²] | Area of Element Region [mm²] | On-resistance [mΩ] | Area of Element Region [mm²] | On-resistance [mΩ] | |
| 0.5 | 1.0 | 0.50 | 0.470 | 21.28 | 0.495 | 20.20 | 94.9 |
| 1.0 | 2.0 | 2.00 | 1.940 | 5.15 | 1.990 | 5.03 | 97.5 |
| 1.5 | 3.0 | 4.50 | 4.410 | 2.268 | 4.485 | 2.230 | 98.3 |

US 10,121,887 B2

INSULATED GATE SEMICONDUCTOR DEVICE AND METHOD

REFERENCE TO RELATED APPLICATIONS

This application is a continuation application of prior U.S. patent application Ser. No. 13/982,668, filed on Sep. 11, 2013 and issued as U.S. Pat. No. 8,981,471 on Mar. 17, 2015, which is a national stage application under 35 USC 371 of International Application No. PCT/JP2012/000875, filed Feb. 9, 2012, which claims the priority of Japanese Patent Application No. 2011-032342, filed Feb. 17, 2011, the entire contents of which are incorporated herein by reference and priority thereto is hereby claimed.

FIELD OF THE INVENTION

The present invention relates to an insulated-gate semiconductor device, and to an insulated-gate semiconductor device which achieves an increase in the area of an element region of a chip and a reduction in the on-resistance.

BACKGROUND OF THE INVENTION

In an insulated-gate semiconductor device having a trench structure, gate electrodes buried in trenches are led out to a substrate surface in peripheral regions along the four sides of a substrate, and are connected to a gate pad portion through wirings extending on the peripheral regions of the substrate (refer to Patent Document 1, for example).

With reference to a plan view of FIG. 9, a conventional insulated-gate semiconductor device is described while a MOSFET (Metal Oxide Semiconductor Field Effect Transistor) is taken as an example.

Referring to FIG. 9, the MOSFET has a surface-mountable structure, for example. A substrate SB constituting a chip is formed by providing an n− type semiconductor layer on an n+ type semiconductor substrate. An element region 520 for a MOSFET having a known structure, for example, a trench structure is disposed in a region inside a chain line of a principal surface of the substrate. The structure of example, to penetrate the p type channel layer; and disposing source regions (not illustrated) around the gate electrodes 507.

A source electrode (not illustrated) connected to the source regions is provided on the substantially entire surface of the element region 520, and a substantially circular source pad portion 527 is provided on the source electrode. Moreover, a substantially circular gate pad portion 528 is provided on the element region 520 with an insulating film interposed therebetween.

The gate electrodes 507 in the element region 520 are connected to a gate lead wiring 508 in the peripheral regions of the substrate SB. The gate lead wiring 508 includes lead portions 508a and a coupling portion 508b. The lead portions 508a are formed by burying polycrystalline silicon in trenches provided in the substrate SB (n− type semiconductor layer), and lead out the gate electrodes 507 to the surface of the substrate SB. The lead portions 508a are spaced from one another, and each extend in a direction orthogonal to the closest side of the substrate SB. The coupling portion 508b is a polycrystalline silicon layer extending on the surface of the substrate SB along each of the sides of the substrate SB in such a way as to be substantially orthogonal to the adjacent lead portions 508a, and connects the multiple lead portions 508a together.

For example, the lead portions 508a are provided at each of the four sides of the substrate SB which are parallel with extending directions of the gate electrodes 507 in the lattice shape in the element region 520. The coupling portion 508b extends substantially annularly in the peripheral regions of the substrate SB while coupling all the lead portions 508a together, and is connected to a protection diode Di provided right under the gate pad portion 528. The gate lead wiring 508 and the protection diode Di are connected to each other through a conductor (resistor) 509 made by doping polycrystalline silicon with a desired impurity. In addition, a gate electrode layer 518 is provided on the gate lead wiring 508. The gate electrode layer 518 is a metal wiring which overlap and is in contact with the gate lead wiring 508, and is connected to the gate pad portion 528.

Patent Document 1: Japanese Patent Application Publication No. 2004-281524

SUMMARY OF THE INVENTION

FIGS. 10A and 10B are magnified schematic plan views of portions of FIG. 9 indicated by broken-line circles. FIG. 10A is a magnified view of a portion of FIG. 9 indicated by a broken line α, and FIG. 10B is a magnified view of another portion of FIG. 9 indicated by a broken line β.

Referring to FIG. 10A, the lead portions 508a of the gate lead wiring 508 form a region (having a width W of 8μ to 10μ, for example) for leading out and connecting the gate electrodes 507 in the element region 520 to the coupling portion 508b outside the element region 520. Although this region is provided in the substrate SB, no source region 515 is disposed and no transistor operation is carried out in the region. In contrast to the element region 520 where transistor cells C are disposed and operate, a region where no transistor cells C are disposed is hereinafter referred to as a non-operating region.

In other words, in the structure as in FIG. 9 where the lead portions 508a are arranged along the sides of the semiconductor substrate (chip) which are parallel with all the extending directions of the gate electrodes 507 in the lattice shape, the non-operating region is formed at the four sides of the chip. The area of the non-operating region reaches about five percent of the total chip area, for example, which limits an increase in the area of the element region 520 and thereby limits a reduction in the on-resistance.

Further, referring to FIG. 10B, no lead portion 508a is disposed in any corner portion of the chip. However, since the coupling portion 508b connecting the lead portions together is provided in an outer peripheral portion of the chip, the coupling portion 508b bends (curves) at a small curvature in the corner portion. In such a case, the element region 520 needs to be spaced from the bending portion by a given clearance T. This causes a problem that the non-operating region further increases in the corner portions where the coupling portion 508b bends.

Note that the non-operating region in the corner portions is generated not only where the coupling portion 508b bends, but also where the conductor 509 or the gate electrode layer 518 bends.

The present invention has been made with the foregoing problems taken into consideration. The problem is solved by an insulated-gate semiconductor device including: a first semiconductor layer of a first general conductivity type; an element region provided in a surface of the first semiconductor layer of the first general conductivity type, and having a transistor cell of an insulated-gate semiconductor element arranged therein; a gate pad portion provided on the element region, and connected to a gate electrode of the transistor cell; a protection diode connected between a source electrode and the gate electrode of the transistor cell; a gate lead wiring disposed on a peripheral portion of the first semiconductor layer of the first general conductivity type, and leading out the gate electrode onto the first semiconductor layer of the first general conductivity type and connect the gate electrode to the gate pad portion; and a conductor connected to the gate lead wiring and the protection diode, the insulated-gate semiconductor device wherein the gate lead wiring and the conductor are provided along one side of the first semiconductor layer of the first general conductivity type linearly without bending.

The following effects can be obtained by the present invention.

First, the non-operating region can be reduced by reducing the area for disposing the lead portions of the gate lead wiring. Thereby, the area of the element region can be increased and the on-resistance can be reduced, as compared with the device of the conventional structure having the same chip size. In addition, in the case where the area of the element region is kept the same as that of the conventional structure, the chip size can be reduced.

Second, since (the coupling portion of) the gate lead wiring and the conductor are provided along one side of the semiconductor substrate linearly without bending, it is possible to prevent the wiring and conductor from forming a curved bending portion in the corner portions of the chip, and thereby to reduce the generation of the non-operating region.

Third, since the protection diode is disposed adjacent to the conductor or the gate lead wiring, it is also possible to minimize the bending portion of the first gate electrode layer which overlap and is connected to these components. Because the bending portion of the first gate electrode layer results in the generation of the non-operating region like the gate lead wiring and so on, minimizing the bending portion enables prevention of an increase in the non-operating region.

Fourth, since the protection diode is placed adjacent to the conductor or the gate lead wiring and the protection diode is made to have such a shape that the portion of the protection diode is disposed in close proximity to the gate pad portion, it is possible to make the shortest the second gate electrode layer which is connected to the protection diode and the gate pad portion. Because a portion below the second gate electrode layer is a region where a single layer out of the source electrode layer of a two-layered structure (only the first source electrode layer) is disposed, reducing the area of this region enables suppression of an increase of the source resistance.

BRIEF DESCRIPTION OF THE DRAWINGS

FIGS. 6A and 6B are comparative tables for describing effects of the present invention.

DETAILED DESCRIPTION OF THE INVENTION

While an n channel type MOSFET is taken as an example, embodiments of the present invention are described with reference to FIGS. 1 to 8.

First of all, a first embodiment is described with reference to FIGS. 1 to 6.

Figure 1A:
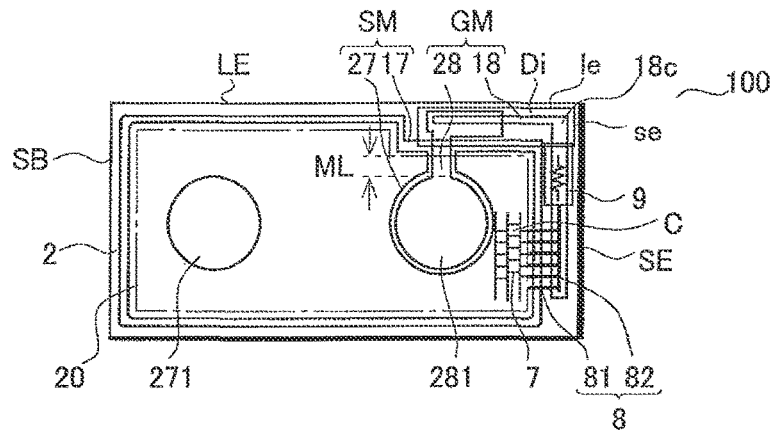
FIGS. 1A to 1C are plan views for describing an insulated-gate semiconductor device of a first embodiment of the present invention.
Figure 1B:
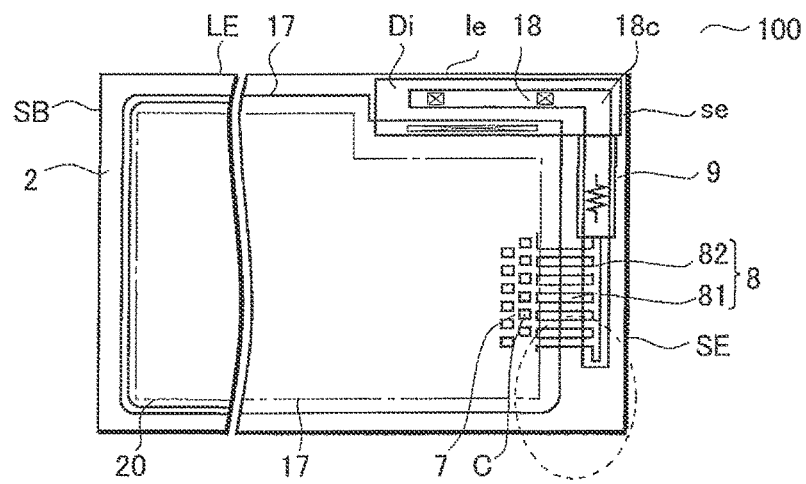
Figure 1C:
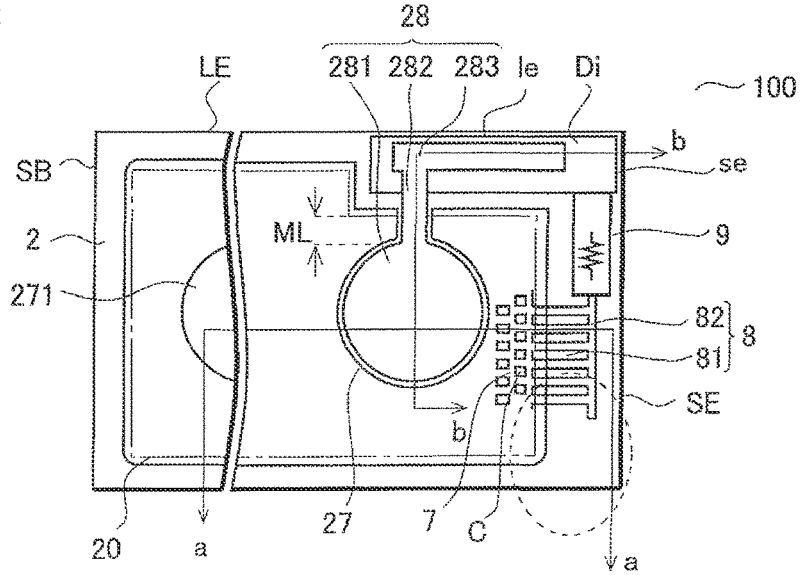

FIGS. 1A to 1C are plan views showing a MOSFET 100 of this embodiment. FIG. 1A is an overall view, FIG. 1B is a view showing the electrode structure of the first layer, and FIG. 1 C is a view showing the electrode structure of the second layer.

Referring to FIG. 1A, the MOSFET 100 includes an n− type semiconductor layer 2, an element region 20, a gate pad portion 281, a protection diode Di, gate lead wiring 8, and a conductor 9.

A substrate SB is formed by stacking the n− type semiconductor layer 2 on an n+ type silicon semiconductor substrate (not illustrated in this drawing), and constitutes a chip of the MOSFET 100. For example, the n− type semiconductor layer 2 is a silicon semiconductor layer formed on the n+ type silicon semiconductor substrate by epitaxial growth or the like, for example. The substrate SB (chip) is provided in the form of a rectangle having long sides LE and short sides SE in the plan view, for example. The element region 20 (chain line) is provided on a surface of the n− type semiconductor layer 2, and transistor cells C of the MOSFET 100 are arranged therein.

The element region 20 is covered with a source electrode layer SM connected to a source region (not illustrated) of the MOSFET 100. The source electrode layer SM has a two-layered structure of a first source electrode layer 17 being the first layer and a second source electrode layer 27 being the second layer. A portion of the second source electrode layer 27 serves as a source pad portion 271.

A gate electrode 7 constituting the transistor cells C is buried in trenches which are provided in the substrate SB to have a lattice shape (polygonal shape) or a stripe shape in the plan view, and is connected to a gate electrode layer GM. The gate electrode layer GM has a two-layered structure of a first gate electrode layer 18 being the first layer and a second gate electrode layer 28 being the second layer. A portion of the second gate electrode layer 28 serves as the gate pad portion 281.

The gate lead wiring 8 is disposed along one side of a peripheral portion of the n− type semiconductor layer 2, and connects the gate electrode 7 to the gate pad portion 281. The gate lead wiring 8 includes: lead portions 81 having the same configuration as the gate electrode 7 in the element region 20 and leading out the gate electrode 7 to the outside of the element region 20; and a coupling portion 82 connecting the lead portions 81 together outside the element region 20. Specifically, the lead portions 81 are made by burying polycrystalline silicon doped with an impurity in trenches provided in the substrate SB, and the coupling portion 82 has a configuration of extending the polycrystalline silicon on a surface of the substrate SB. The lead portions 81 are provided in the form of stripes parallel with the long sides LE of the chip, for example, in the plan view. The coupling portion 82 extends linearly without bending along one of the short sides SE of the chip, for example, in the plan view, and couples the multiple adjacent lead portions 81 together.

The conductor 9 is connected to the gate lead wiring 8 and the protection diode Di. The conductor 9 is a resistor formed by doping polycrystalline silicon with an impurity and having a desired resistance value.

The protection diode Di has a polycrystalline silicon layer constituting its outer peripheral ends which is provided in the form of a rectangle with long sides le and short sides se, and is disposed on the surface of the substrate SB in one corner portion of the chip in such a way that the long sides le and the short sides se extend along the long sides LE and the short sides SE of the chip, respectively. The protection diode Di does not overlap the gate pad portion 281, and is provided outside the element region 20.

The electrode structure of the first layer is described with reference to FIG. 1B.

The first gate electrode layer 18 is superposed on the gate lead wiring 8 and the conductor 9, and is connected to each of them. The first gate electrode layer 18 extends continuously to the protection diode Di, and is connected to one end of the protection diode Di and to the second gate electrode layer. The first gate electrode layer 18 has a bending portion 18c provided in the form of the letter L in the plan view, for example.

The first source electrode layer 17 is provided on the substantially entire surface of the element region 20, and is connected to the other end of the protection diode Di and to the second source electrode layer.

The second electrode layer is described with reference to FIG. 1 C.

The second gate electrode layer 28 is provided on the first source electrode layer with an insulating film interposed therebetween, and is formed of the gate pad portion 281, a wiring portion 282, and a connection portion 283. The connection portion 283 is connected to one end of the first gate electrode layer 18 on the protection diode Di. The wiring portion 282 is a wiring for connecting the connection portion 283 and the gate pad portion 281 together, and connects the protection diode Di and the gate pad portion 281 together with the shortest distance ML.

The distance ML of the wiring portion 282 denotes the length of the wiring portion 282 extending in the element region 20. In the case where the gate pad portion 281 is formed in a circle as in FIGS. 1A to 1C, for example, the distance ML is a distance from an outer circumferential end portion of the gate pad portion 281 to an end portion of the element region 20.

The second source electrode layer 27 is provided directly on the first source electrode layer 17 except for a region where the second gate electrode layer 28 is disposed, and a portion of the second source electrode layer 27 serves as the source pad portion 271.

Figure 2:
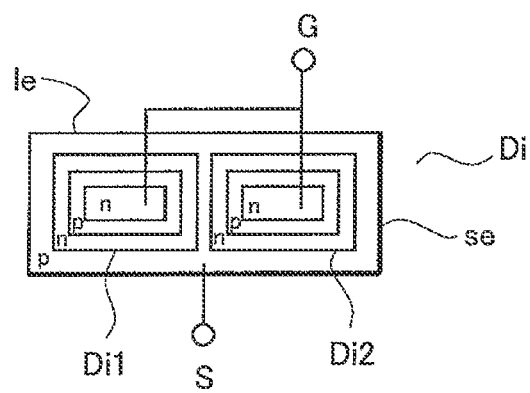
FIG. 2 is a schematic plan view for describing the insulated-gate semiconductor device of the first embodiment of the present invention.

FIG. 2 is a plan view showing the protection diode Di of this embodiment.

As an example, the protection diode Di is a bidirectional diode provided with multiple pn junctions by: providing the polycrystalline silicon layer, constituting its outer peripheral ends, in the form of a rectangle with the long sides le and the short sides se; and alternately and concentrically arranging thereon n type semiconductor regions and p type semiconductor regions each provided in the form of a rectangle or a ring such as a circle (oval). Shown here as an example is the case of adjacently arranging two protection diodes Di1, Di2 of the same configuration where pn junctions are provided concentrically. These protection diodes Di1, Di2, for example, each have an innermost peripheral portion connected to the first gate electrode layer and an outermost peripheral portion connected to the first source electrode layer, and are thereby connected in parallel between a gate G and a source S of the MOSFET 100. The protection diodes Di1, Di2 protect a gate insulating film (not illustrated) against electrostatic breakdown and the like.

The long sides le of the protection diode Di each have such a length that a portion of the protection diode Di can be disposed in close proximity to the gate pad portion 281 (see FIG. 1 C). The length of each short side se of the protection diode Di is selected appropriately depending on the breakdown voltage of the protection diode Di and the length of each long side le. As an example, the protection diode Di is in the form of a rectangle having the long sides le twice as long as the short sides se. Here, the shape of the protection diode Di is not limited to the illustrated one. In this embodiment, the protection diode Di is in the form of a rectangle (strip), part of which is disposed in close proximity to the gate pad portion 28.

Employing such a configuration enables a reduction of the area which the protection diode occupies as compared with the case of providing one concentric protection diode having the same characteristics, such as the electrostatic breakdown voltage, breakdown voltage, and leak current, as the above protection diode.

Referring to FIGS. 1A to 1 C again, in this embodiment, the coupling portion 82 of the gate lead wiring 8 and the conductor 9 are provided, along one side of the n− type semiconductor layer 2 (chip), in the form of a straight line not having a bending portion. Shown here is an example where the coupling portion 82 and the conductor 9 are arranged along one of the short sides SE of the chip.

In the case where the gate electrode 7 in the element region 20 has a lattice-shaped (polygonal-shaped) pattern in the plan view, the gate lead wiring 8 (coupling portion 82) does not necessarily have to be disposed entirely along the side of the element region 20 facing one side of the chip. Specifically, in the case where the gate electrode 7 has a lattice shape, the gate lead wiring 8 can apply a gate potential to the whole gate electrode 7 as long as the gate lead wiring 8 is continuous with a portion of the gate electrode 7 (for example, the gate electrode 7 in about a half of the side of the element region 20 facing one short side SE of the chip). In other words, the length with which no bending portion is formed is selected appropriately for the coupling portion 82.

In addition, the protection diode Di, the gate lead wiring 8, and the conductor 9 are arranged adjacent to one another. Specifically, as described previously, the protection diode Di is disposed in the corner portion of the chip in such a way that the long side le extends along the long side LE of the chip. Meanwhile, the conductor 9 and the coupling portion 82 of the gate lead wiring 8 are arranged along the short side SE of the chip. The conductor 9 and the coupling portion 82 of the gate lead wiring 8 have no bending portion. Further, the first gate electrode layer 18 connected to these is shaped to overlap them, and the number of the bending portion 18c is one or less (see FIG. 1B).

These are arranged adjacent to one another with no other constituent interposed therebetween. For example, the corner portion of the chip where the protection diode Di is disposed is occupied by (a corner portion of) the protection diode Di. In this corner portion of the chip, only the protection diode Di is disposed on the long side LE side of the chip; and the protection diode Di, the conductor 9, and the coupling portion 82 of the gate lead wiring 8 are arranged side by side on the short side SE side of the chip (see FIG. 1 C).

By disposing the gate lead wiring 8 along only one short side SE of the chip, the area for disposing the gate lead wiring 8 on the chip can be reduced. This makes it possible to reduce the non-operating region, and thereby to increase the area of the element region 20 and reduce the on-resistance as compared with a conventional structure in which a gate lead wiring is provided along four sides of a chip of the same size. In the case where the area of the element region 20 is kept the same as that of the conventional structure, a reduction of the chip size can be achieved.

Further, since the coupling portion 82 of the gate lead wiring 8 and the conductor 9 are provided along one side of the semiconductor substrate linearly without bending, it is possible to prevent the coupling portion 82 of the gate lead wiring 8 and the conductor 9 from forming a curved bending portion in the corner portions of the chip, and thereby to expand the element region 20.

Figure 3:
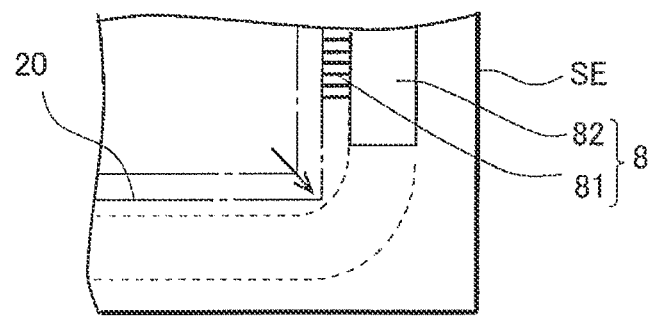
FIG. 3 is a schematic plan view for describing the insulated-gate semiconductor device of the first embodiment of the present invention.

A specific description thereof is given with reference to FIG. 3. FIG. 3 is a schematic plan view of a portion of FIG. 1B indicated by a broken-line circle.

Figure 10A:
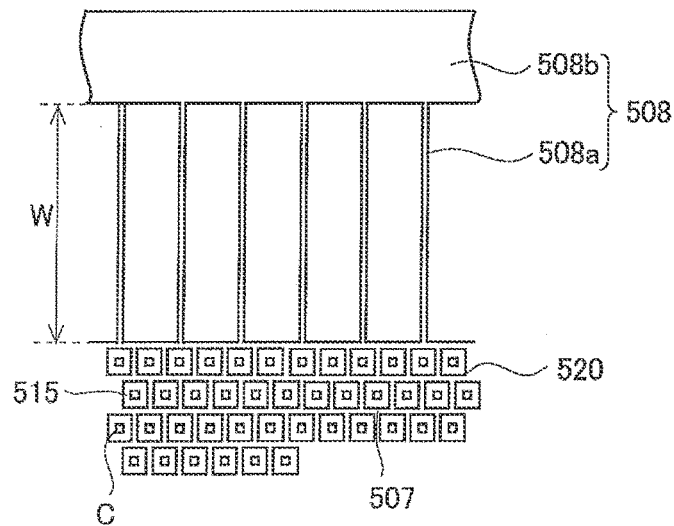
FIGS. 10A and 10B are plan views for describing the conventional Insulated-gate semiconductor device.
Figure 10B:
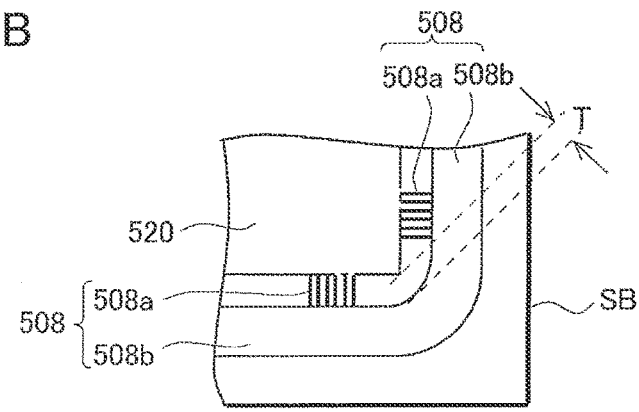

In this embodiment, no bending portion of the coupling portion 82 or no bending portion of the conductor 9 is disposed in the corner portions of the chip. Hence, there is no constraint by a clearance T between the coupling portion (conductor) and the element region (see FIG. 10B) which would otherwise be taken into consideration if either the coupling portion or the conductor bends as indicated by broken lines. This makes it possible to increase the element region 20 from a region indicated by a thin chain line to a region indicated by a thick chain line.

This also makes it possible to minimize the bending portion of the first gate electrode layer 18 which overlap and is connected to the conductor 9 and the gate lead wiring 8. Although there is a case of bending the first gate electrode layer 18 as shown in FIG. 1B for its connection with the protection diode Di, for example, no first gate electrode layer 18 is disposed in the corner portion shown in FIG. 3. Because the bending portion of the first gate electrode layer 18 also results in the generation of the non-operating region, minimizing the bending portion enables prevention of an increase in the non-operating region.

Here, even in the case of bending the first gate electrode layer 18 for its connection with the protection diode Di, employing the arrangement as shown in FIG. 1B makes it possible to minimize the generation of the non-operating region. Specifically, when the protection diode Di, the conductor 9, and the coupling portion 82 are arranged adjacently along the short side SE of the chip with the corner portion of the protection diode Di and the corner portion of the chip aligned, the bending portion 18c of the first gate electrode layer 18 is disposed along the corner portion of the protection diode Di. Because no transistor cell can be disposed in a region under the protection diode Di in the first place, the only bending portion of the first gate electrode layer 18 is laid on this region. Thereby, the non-operating region can be prevented from being generated in another region due to the bending of the first gate electrode layer 18.

Figure 4:
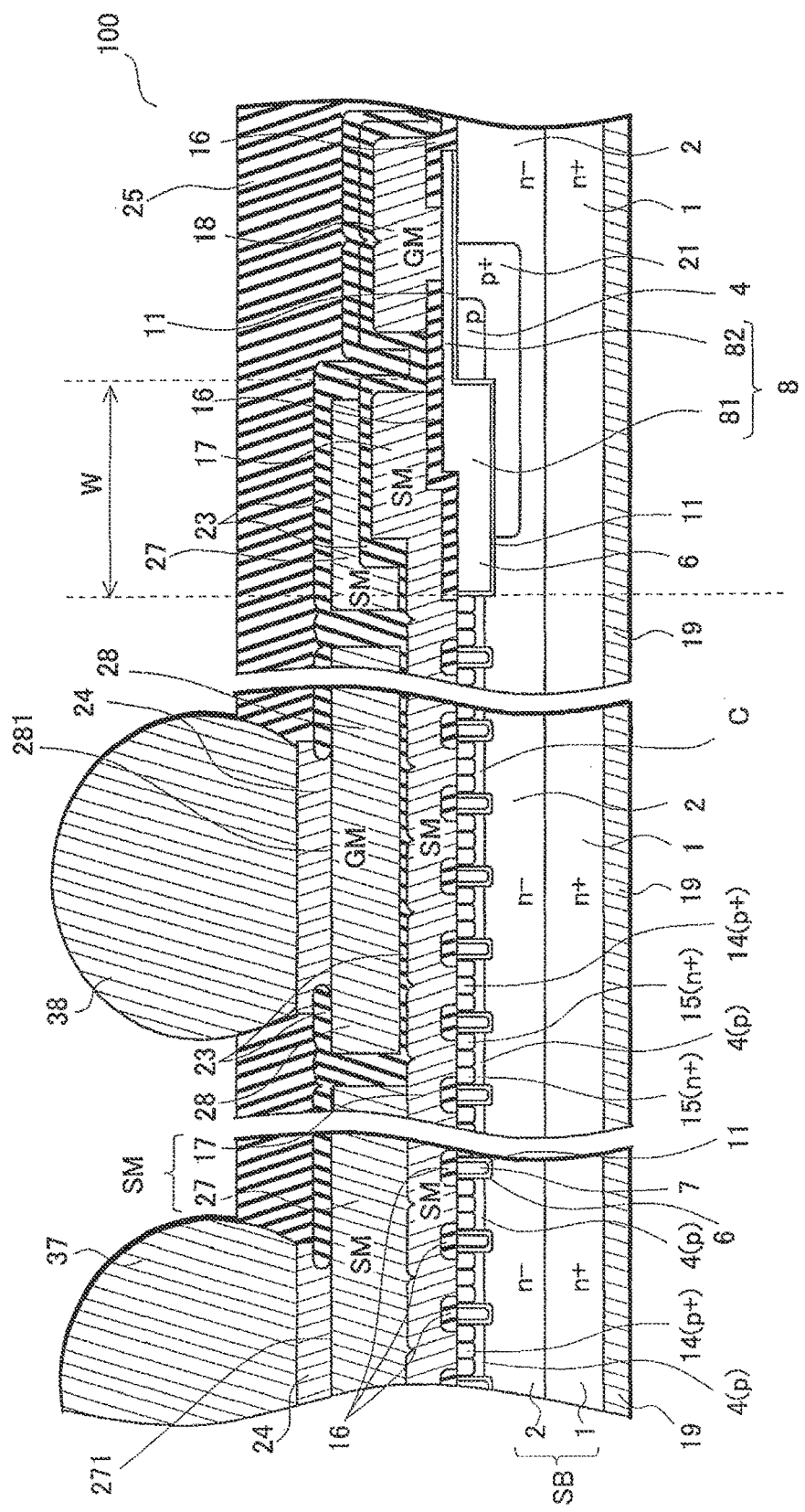
FIG. 4 is a cross-sectional view for describing the insulated-gate semiconductor device of the first embodiment of the present invention.

FIG. 4 is a cross-sectional view of FIG. 1 C taken along the line a-a.

The substrate SB has a configuration in which the n− type semiconductor layer (n− type silicon epitaxial layer, for example) 2 is provided on an n+ type silicon semiconductor substrate 1. A channel layer 4 which is a p type impurity region is provided in a surface of the n− type semiconductor layer 2 to be a drain region.

Trenches 6 penetrate the channel layer 4 to reach the n− type semiconductor layer 2. A gate insulating film 11 is provided on the inner wall of each trench 6. The film thickness of the gate insulating film 11 is about several hundreds of angstroms corresponding to the drive voltage of the MOSFET 100. Further, a gate electrode 7 is provided inside the trench 6 by burying a conductive material therein. For example, the conductive material is polycrystalline silicon in which an n type impurity, for example, is introduced for reducing resistance.

Source regions 15 are n+ type impurity regions made by injecting an n type impurity in a surface of the channel layer 4 adjacent to each trench 6. In addition, body regions 14 which are p+ type impurity diffusion regions are provided in the surface of the channel layer 4 between every adjacent source regions 15 for the purpose of stabilizing the potential of the substrate. Thereby, a portion surrounded by adjacent trenches forms one transistor cell C. The element region 20 of the MOSFET 100 is constituted by an aggregate of many transistor cells C.

In this cross section, the gate lead wiring 8 is provided in an outer peripheral end portion of the element region 20. The gate lead wiring 8 is formed of the lead portions 81 and the coupling portion 82. The lead portions 81 are regions made by burying polycrystalline silicon, which is the same as that of the gate electrode 7, in the trenches 6 extending only in a horizontal direction from the outer peripheral end portion of the element region 20 in the cross section of FIG. 4. A width W of each lead portion 81 is about 8 μm to 10 μm, for example. Meanwhile, the coupling portion 82 is a region for leading out the polycrystalline silicon of the lead portions 81 to the surface of the substrate SB in an outer peripheral end portion of the channel layer 4.

Note that, in this embodiment, the element region 20 denotes a region where the transistor cells C are arranged, and is defined as a region extending to an end portion of the lead portions 81 in FIG. 4.

A high-concentration p type impurity region 21 is provided on an outer periphery of the channel layer 4. The p type impurity region 21 is a so-called guard ring region for easing the curvature of an end portion of a depletion layer which spreads from the channel layer 4 into the n− type semiconductor layer 2 when a reverse bias is applied to the element region 20.

The first source electrode layer 17 and the first gate electrode layer 18 constitute the first electrode layer. The first gate electrode layer 18 is provided on the coupling portion 82 while overlapping it, and is connected to the coupling portion 82 through a contact hole provided in an interlayer insulating film 16. The first gate electrode layer 18 extends to the protection diode (not illustrated) and is connected to the one end of the protection diode.

The first source electrode layer 17 is a metal electrode made by: sputtering aluminum (Al) or the like; and patterning it into a desired shape. The first source electrode layer 17 is provided to cover the entire surface of the element region 20, and is connected to the source regions 15 and the body regions 14 through a contact hole provided between portions of the interlayer insulating film 16. In addition, the first source electrode layer 17 is connected to the other end of the protection diode (not illustrated).

An insulating film (nitride film) 23 is provided in a desired pattern on the first source electrode layer 17 and the first gate electrode layer 18, and the second source electrode layer 27 and the second gate electrode layer 28 constituting the second electrode layer are provided thereon. The second source electrode layer 27 and the second gate electrode layer 28 are metal electrodes made by: sputtering aluminum (Al) or the like; and patterning them into a desired shape.

The second gate electrode layer 28 is disposed on some of the transistor cells C and a portion of the first source electrode layer 17 with the insulating film 23 interposed therebetween. A portion under a region where the second gate electrode layer 28 is disposed is a region where only the first source electrode layer 17 is disposed, i.e., is a region where a single layer out of the source electrode layer SM is disposed.

The second source electrode layer 27 is not provided in a region where the second gate electrode layer 28 is disposed, but substantially overlaps the first source electrode layer 17 in a region other than this region.

The insulating film (nitride film) 23 is further provided on the surfaces of the second source electrode layer 27 and the second gate electrode layer 28, and portions of this insulating film are opened. Through the openings, portions of the second source electrode layer 27 and the second gate electrode layer 28 are exposed as the source pad portion 271 and the gate pad portion 281, respectively.

UBMs (Under Bump Metals) 24 are respectively provided on the source pad portion 271 and the gate pad portion 281. The UBMs 24 are electroless plating metal layers, for example. In addition, polyimide 25 to which the UBMs 24 are exposed is provided on the insulating film 23, and screen printing is performed using the UBMs 24 as base electrodes. Thereby, a source bump electrode 37 and a gate bump electrode 38 are provided on the source pad portion 271 and the gate pad portion 281, respectively. Although the foregoing description has been made citing an example where the external connection electrodes are the bump electrodes, a bonding wire and the like may be used instead. A drain electrode 19 is provided on a back surface side of the substrate SB.

Figure 5:
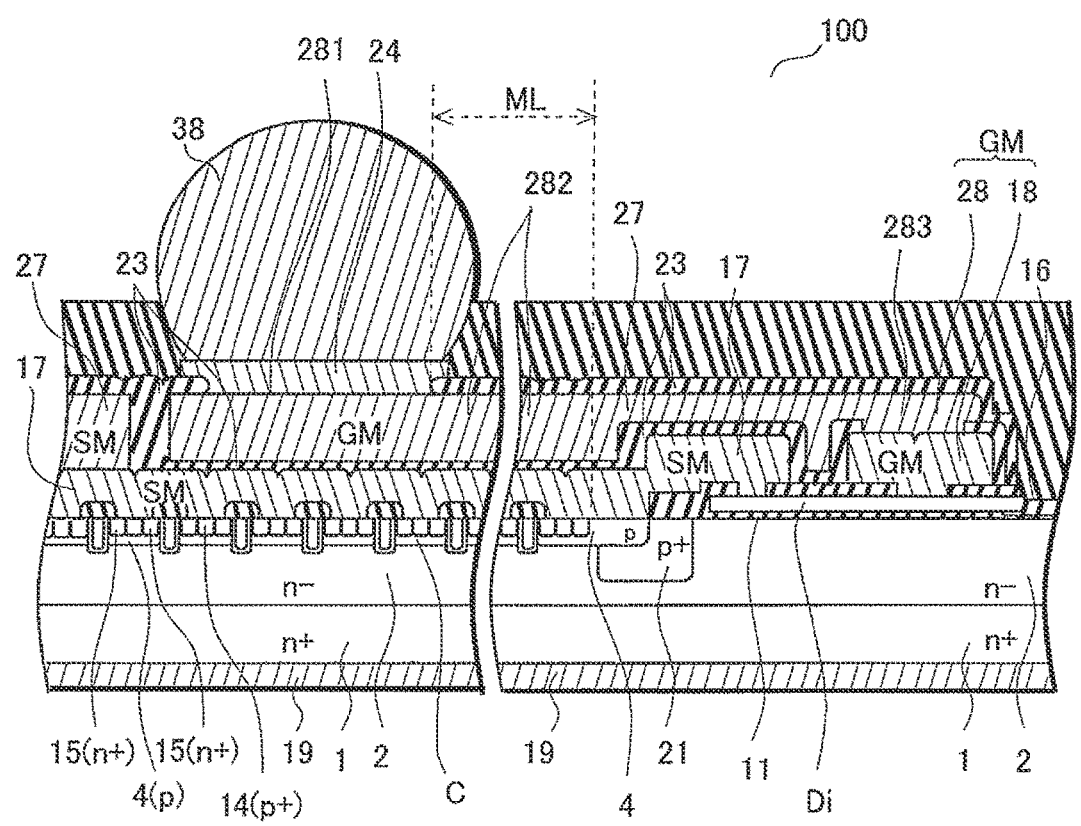
FIG. 5 is a cross-sectional view for describing the insulated-gate semiconductor device of the first embodiment of the present invention.

FIG. 5 is a cross-sectional view of FIG. 1 C taken along the line b-b.

The second gate electrode layer 28 is formed of the gate pad portion 281, the wiring portion 282, and the connection portion 283. Only the first source electrode layer 17 is provided below the gate pad portion 281 and the wiring portion 282. The transistor cells C are disposed also under a portion of the wiring portion 282. The first gate electrode layer 18 is provided below the connection portion 283. Through the first gate electrode layer 18, the connection portion 283 is connected to the one end of the protection diode Di located below the first gate electrode layer 18. The other end of the protection diode Di is connected to the first source electrode layer 17. Thereby, the configuration in which the protection diode Di is connected between the gate and the source of the MOSFET 100 can be achieved. The other portions of the configuration of FIG. 5 are the same as those of FIG. 4 and are thus not described.

The resistance of the source electrode layer SM increases in the region where only the first source electrode layer 17 is disposed as compared with the region having the two-layered structure of the first source electrode layer 17 and the second source electrode layer 28. However, this embodiment makes it possible to reduce the region where only the first source electrode layer 17 is disposed, and accordingly to suppress the increase in the resistance of the source electrode layer SM, by: making the protection diode Di have such a shape that the portion of the protection diode Di is disposed in close proximity to the gate pad portion 281; and thereby minimizing the distance ML of the wiring portion 282.

In the surface mount (flip chip mount) MOSFET 100 as shown in FIG. 1A, in particular, the positions of the source pad portion 271 and the gate pad portion 281 cannot be changed freely due to the constraint by the wiring pattern on the mounted substrate side. Besides, in this embodiment, the coupling portion 82 of the gate lead wiring 8 and the conductor 9 are linearly provided on the same side of the chip, and the protection diode Di is disposed adjacent to the conductor 9, for example, so that the bending portion 18c of the first gate electrode layer 18 can also be minimized.

In this way, as described above, the external shape and the position of the protection diode Di are selected in such a way that the distance ML of the wiring portion 282 of the second gate electrode layer 28 becomes the smallest.

Note that, although the shape of the chip in the first embodiment is rectangular, the shape of the chip is not limited to this but may be square instead. In addition, although the description has been given while the case where the trenches 6 (gate electrode 7) in the element region 20 have a lattice shape is taken as an example, the trenches 6 (gate electrode 7) may be in the form of stripes parallel with the sides of the chip.

In the case where the shape of the chip is rectangular and the trenches 6 (gate electrode 7) in the element region 20 have a stripe shape, in particular, the gate electrode 7 is disposed along and in parallel with the long sides LE of the chip; and, in the gate lead wiring 8, the lead portions 81 are provided parallel with the long sides LE of the chip, and the coupling portion 82 is disposed parallel with the short sides SE of the chip.

In the case where the gate electrode 7 has a stripe shape, the whole gate electrode 7 needs to be continuous with the lead portions 81 unlike the case where the gate electrode 7 has a lattice shape (FIGS. 1A to 1 C). Accordingly, the coupling portion 82 is disposed parallel with the short sides SE of the chip. Thereby, the non-operating area can be made smaller than in the case where the coupling portion 82 is disposed parallel with the long sides LE thereof.

FIGS. 6A and 6B are comparative tables showing the effects of this embodiment brought about by reducing the area for disposing the gate lead wiring 8. FIG. 6A shows the case where the shape of the chip is square (in which the length of each side is X mm (Y mm)) in the plan view, and FIG. 6B shows the case where the shape of the chip is rectangular (in which the lengths of the sides are X mm and Y mm) in the plan view.

Figure 9:
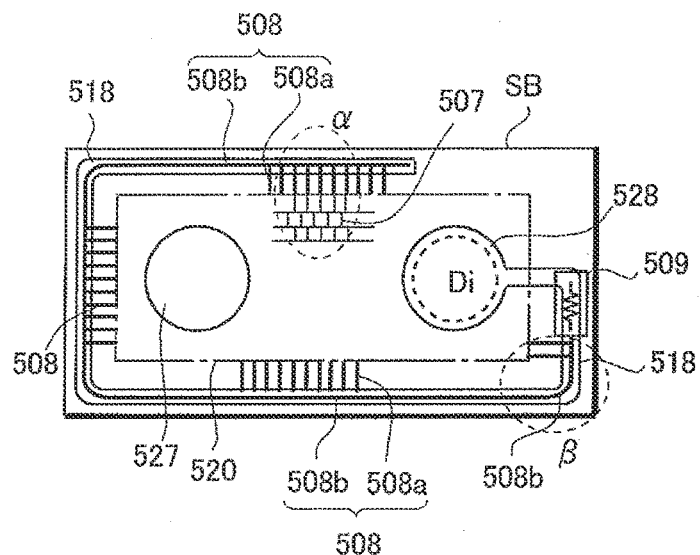
FIG. 9 is a plan view for describing a conventional insulated-gate semiconductor device.

For three types of chip areas, a comparison of the area of the element region and the on-resistance was made between the conventional structure (FIG. 9) where the gate lead wiring is provided along the four sides of the chip and the structure of this embodiment where the gate lead wiring 8 is provided along only one side of the chip.

The on-resistance reduction effect indicates the ratio of the on-resistance of this embodiment to that of the conventional structure, and a smaller value denotes smaller on-resistance. From these tables, it is learned that: reducing the area for disposing the gate lead wiring 8 obviously reduces the on-resistance; and that, in both cases, a smaller chip size is more advantageous to a reduction of the on-resistance.

A second embodiment of the present invention is described with reference to FIGS. 7A and 7B. The second embodiment shows another mode where the first gate electrode layer 18 is in the form of the letter L.

Figure 7A:
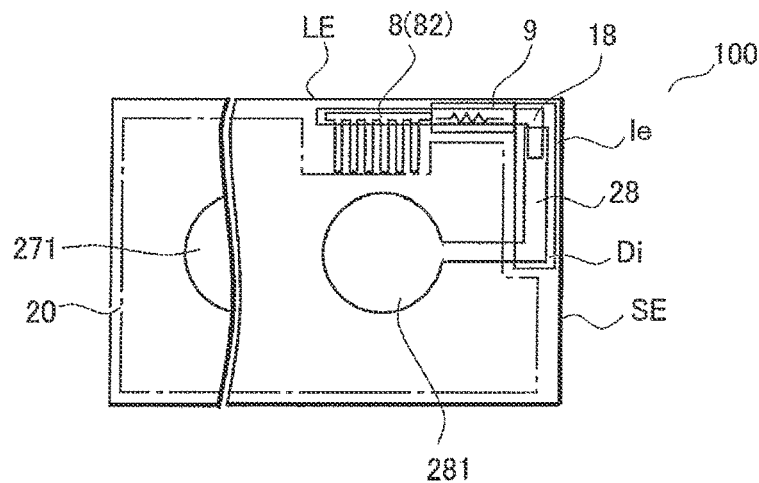
FIGS. 7 A and 7B are plan views for describing an insulated-gate semiconductor device of a second embodiment of the present invention.

For example, as shown in FIG. 7A, the device may have such a configuration that: one of the long sides le of the protection diode Di is disposed along one of the short sides SE of the chip; and the conductor 9 and the coupling portion 82 of the gate lead wiring 8 are disposed along one of the long sides LE of the chip.

In this case, too, the coupling portion 82 of the gate lead wiring 8 and the conductor 9 are disposed on the same side (long side LE) linearly without bending, and one end of the protection diode Di is disposed in close proximity to the gate pad portion 281.

Figure 7B:
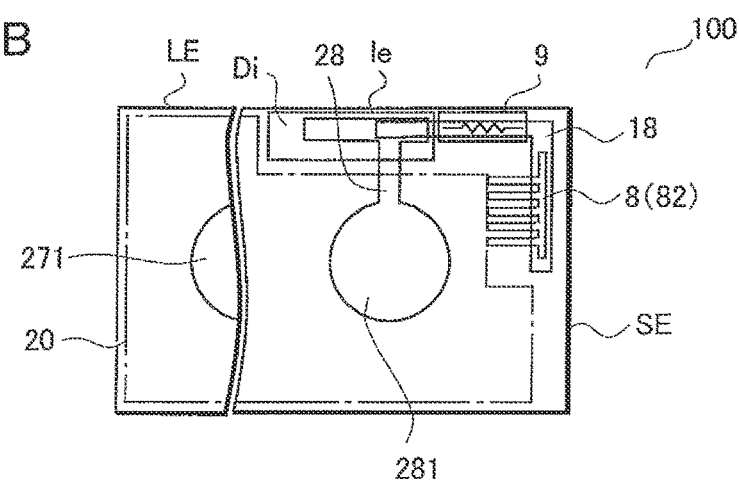

Alternatively, as shown in FIG. 7B, the device may have such a configuration that: the protection diode Di and the conductor 9 are adjacently arranged in such a way that one of the long sides le of the protection diode Di and the conductor 9 extend along one of the long sides LE of the chip; and that the coupling portion 82 is disposed on the short side SE side of the chip. Although the non-operating region is formed by the bending of the first gate electrode layer 18, the area for disposing the gate lead wiring 8 is so small that neither the gate lead wiring 8 nor the conductor 9 bends. Thus, the non-operating region can be made smaller than that of the conventional structure.

Figure 8:
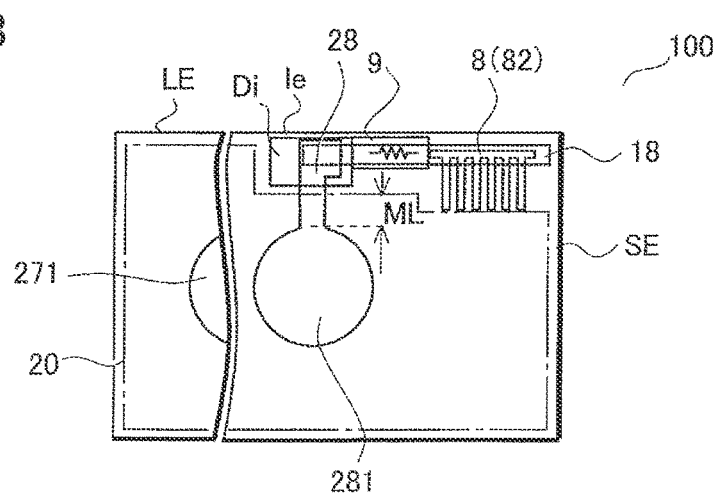
FIG. 8 is a plan view for describing an insulated-gate semiconductor device of a third embodiment of the present invention.

A third embodiment of the present invention is described with reference to FIG. 8.

The third embodiment shows the case where both the coupling portion 82 of the gate lead wiring 8 and the conductor 9 are linear without bending, and these components and one of the long sides le of the protection diode Di are disposed on the same side. They are disposed adjacently without being separated from one another. They may be disposed along one of the long sides LE of the chip, or instead may be disposed along one of the short sides SE thereof. In this case, the first gate electrode layer 18 is also in the form of a straight line not having a bending portion.

In this case, the distance ML of the wiring portion 282 is made the smallest by changing the shape of the protection diode Di and the length of the conductor 9 or the coupling portion 82 appropriately, for example.

Further, since the protection diode Di is connected between the gate and the source of the MOSFET 100 and the conductor (resistor) 9 is connected to the gate in series, the arrangement of the gate lead wiring 8, the conductor 9, and the protection diode Di is not limited to an illustrated one as long as the arrangement can achieve such a circuit configuration. For example, the device may have such a configuration that the gate lead wiring 8 is disposed between the protection diode Di and the conductor 9 by use of a multilayer wiring structure.

Note that, although the above embodiment has been described while taking as an example the case (see FIG. 2) of connecting in parallel the two concentric protection diodes Di1, Di2 of the same configuration (having the two centers), the present invention is not limited to this case. Specifically, the protection diode Di may be one concentric protection diode (having one center) having pn junctions formed therein and having an overall external shape in the form of a rectangle having long sides le and short sides se. Alternatively, the protection diode Di may have such a configuration that three or more concentric protection diodes (having three or more centers) are connected in parallel. Still alternatively, the protection diode Di may have such a shape that multiple square protection diodes Di1, Di2 are arranged in a line.

Further, the annular pattern forming the pn junctions may be in the form of a rectangle, a circle (oval), a polygon, and the like.

Furthermore, not limited to the annular pattern, the pn junctions may be formed by alternately arranging pn junction surfaces in one direction in such a way that end portions of the pn junctions are exposed in a stripe shape.

The embodiments have been described above while taking as an example the case of disposing then channel type MOSFET 100 in the element region 20. However, the same effect can be achieved with a p channel type MOSFET having a general conductivity type opposite to that of the n channel type MOSFET 100, or with an insulated-gate semiconductor device for a secondary-battery protection circuit in which two MOSFETs having a common drain are arranged on one chip.

Further, although the description has been given while taking as an example the MOSFET of a trench structure, the invention may be embodied in the same way with a MOSFET of a planar structure in which a gate electrode 7 is provided on a surface of a substrate.

Furthermore, the invention may be embodied in the same way and the same effect can be achieved with an n channel type IGBT (Insulated Gate Bipolar Transistor) in which a p type semiconductor region underlying the n+ type silicon semiconductor substrate 1 shown in FIG. 4 is provided, or with a p channel type IGBT having a general conductivity type opposite to then channel type IGBT.

The invention claimed is:

1. A semiconductor device comprising:
a first semiconductor layer of a first general conductivity type and provided in the form of a rectangle having long sides and short sides in a plan view;
an element region in a surface of the first semiconductor layer and having a transistor cell of an insulated-gate semiconductor element arranged therein;
a gate pad portion on the element region and coupled to a gate electrode of the transistor cell;
a gate lead wiring electrically coupling the gate electrode to the gate pad portion, wherein the gate lead wiring comprises:
lead portions disposed within the first semiconductor layer, directly connected to the gate electrode, and leading out the gate electrode to a peripheral portion of the first semiconductor layer that is outside of the element region, wherein the lead portions are provided as generally parallel and spaced-apart stripes in the plan view, wherein the stripes are parallel to the long sides in the plan view; and
a coupling portion connecting the lead portions together outside of the element region on the peripheral portion, wherein the coupling portion is parallel to the short sides in the plan view;
a conductor connected to the coupling portion on the peripheral portion, wherein the coupling portion and the conductor are provided along one short side of the first semiconductor layer linearly without bending; and
a protection diode connected between a source electrode and the gate electrode of the transistor cell, wherein the conductor is further electrically coupled to the protection diode, and wherein the protection diode does not overlap the gate pad portion and is located outside of the element region, and wherein the protection diode is in the form of a rectangle having long sides and short sides in the plan view, and wherein the long sides of the protection diode are disposed to be parallel to the long sides of the first semiconductor layer and orthogonal to the coupling portion in the plan view.

2. The semiconductor device according to claim 1, wherein the protection diode is disposed in a corner portion of the semiconductor device.

3. The semiconductor device according to claim 1, wherein the protection diode, the coupling portion, and the conductor are arranged adjacently; and wherein the lead portions are provided along only the one short side.

4. The semiconductor device according to claim 1, wherein the protection diode is disposed along one long side.

5. The semiconductor device according to claim 1, wherein the protection diode is disposed in close proximity to the gate pad portion.

6. The semiconductor device according to claim 1 further comprising a first gate electrode layer extending on the coupling portion and the conductor and being connected to one end of the protection diode, wherein the first gate electrode layer bends at most at one portion.

7. The semiconductor device according to claim 6 further comprising a second gate electrode layer connected to the first gate electrode layer on the protection diode is provided, wherein the gate pad portion is a portion of the second gate electrode layer.

8. The semiconductor device according to claim 1, wherein the protection diode comprises a bidirectional diode provided with more than one pn junction.

9. The semiconductor device according to claim 8, wherein the bidirectional diode comprises two pn junctions provided concentrically.

10. The semiconductor device according to claim 1, wherein the protection diode is provided in a polycrystalline semiconductor layer.

11. The semiconductor device according to claim 1, wherein
the gate electrode has a stripe shape and extends along the long sides.

12. The semiconductor device according to claim 1, wherein:
the lead portions comprise polycrystalline semiconductor material buried in trenches provided in the first semiconductor layer; and
the lead portions are provided generally perpendicular to the one short side.

13. The semiconductor device of claim 1, wherein the conductor comprises a polycrystalline semiconductor resistor.

14. A method of forming a semiconductor device comprising:
providing a first semiconductor layer of a first general conductivity type and provided in the form of a rectangle having long sides and short sides in a plan view;
providing an element region in a surface of the first semiconductor layer and having a transistor cell of an insulated-gate semiconductor element arranged therein;
forming a gate pad portion on the element region and connected to a gate electrode of the transistor cell;
forming a gate lead wiring electrically coupling the gate electrode to the gate pad portion, wherein the gate lead wiring comprises:
lead portions disposed within the first semiconductor layer, directly connected to the gate electrode, and leading out the gate electrode to a peripheral portion of the first semiconductor later that is outside of the element region, wherein the lead portions are provided as generally parallel and spaced-apart stripes in the plan view, wherein the stripes are parallel to the long sides in the plan view; and
a coupling portion connecting the lead portions together outside of the element region on the peripheral portion;
forming a conductor on the peripheral portion and connected to the coupling portion, wherein the coupling portion and the conductor are provided along one side of the first semiconductor layer of the first general conductivity type linearly without bending in the plan view; and
forming a protection diode connected between a source electrode and the gate electrode of the transistor cell, wherein the conductor is further electrically coupled to the protection diode, and wherein the protection diode does not overlap the gate pad portion and is located outside of the element region, and wherein the protection diode is in the form of a rectangle having long sides and short sides in the plan view, and wherein the long sides of the protection diode are disposed to be parallel to the long sides of the first semiconductor layer and orthogonal to the coupling portion in the plan view.

15. The method of claim 14, wherein forming the protection diode comprises disposed the protection diode in a corner portion of the semiconductor device.

16. The method of claim 15 further comprising forming a first gate electrode layer extending on the coupling portion and the conductor and being connected to one end of the protection diode, wherein the first gate electrode layer bends at most at one portion, and wherein forming the gate lead wiring comprising forming the lead portion along only the one side.

17. The method of claim 14, wherein the forming gate lead wiring comprises:
forming the lead portions comprising doped polycrystalline semiconductor material buried in trenches provided in the first semiconductor layer; and
forming the coupling portion comprising doped polycrystalline semiconductor material, wherein coupling portion has a configuration of extending the lead portions on a surface of the first semiconductor layer.

18. A method of forming an insulated-gate semiconductor device comprising:
providing a first semiconductor layer of a first general conductivity type and provided in the form of a rectangle having long sides and short sides in a plan view;
providing an element region in a surface of the first semiconductor layer of the first general conductivity type, and having a transistor cell of an insulated-gate semiconductor element arranged therein;
forming a gate pad portion on the element region and connected to a gate electrode of the transistor cell;
forming a protection diode connected between a source electrode and the gate electrode of the transistor cell;
forming a gate lead wiring comprising:
lead portions disposed within the first semiconductor layer, directly connected to the gate electrode, and leading out the gate electrode to the outside of the element region to the peripheral portion of the first semiconductor layer that is outside of the element region, wherein the lead portions are provided as generally parallel and spaced-apart stripes in the plan view, wherein the stripes are parallel to the long sides in the plan view; and a coupling portion directly contacting and connecting the lead portions together on the peripheral portion; and forming a conductor connected to the coupling portion and the protection diode, wherein the coupling portion and the conductor are provided along one side of the first semiconductor layer of the first general conductivity type linearly without bending in the plan view, wherein:

the protection diode does not overlap the gate pad portion and is located outside of the element region;

the protection diode is in the form of a rectangle having long sides and short sides in the plan view;

the long sides of the protection diode are disposed to be parallel to the long sides of the first semiconductor layer and orthogonal to the coupling portion in the plan view; and the protection diode is disposed in a corner portion of the semiconductor device.

19. The method of claim 18 further comprising:

forming a first gate electrode layer extending on the coupling portion and the conductor and being connected to one end of the protection diode, wherein the first gate electrode layer bends at most at one portion.

20. The method of claim 19 further comprising forming a second gate electrode layer connected to the first gate electrode layer, and wherein forming the gate pad portion comprises forming the gate pad portion as a portion of the second gate electrode layer.

21. The method of claim 19, wherein forming the gate lead wiring comprises forming the lead portions along only the one side.

22. The method of claim 19, wherein forming the protection diode comprises forming a bidirectional diode provided with more than one pn junction.

* * * * *